United States Patent
Desouza et al.

(10) Patent No.: US 7,465,992 B2
(45) Date of Patent: Dec. 16, 2008

(54) FIELD EFFECT TRANSISTOR WITH MIXED-CRYSTAL-ORIENTATION CHANNEL AND SOURCE/DRAIN REGIONS

(75) Inventors: Joel P. Desouza, Putnam Valley, NY (US); Devendra K. Sadana, Pleasantville, NY (US); Katherine L. Saenger, Ossining, NY (US); Chun-yung Sung, Poughkeepsie, NY (US); Min Yang, Yorktown Heights, NY (US); Haizhou Yin, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 341 days.

(21) Appl. No.: 11/116,053

(22) Filed: Apr. 27, 2005

(65) Prior Publication Data

US 2006/0244068 A1    Nov. 2, 2006

(51) Int. Cl.
*H01L 29/06*    (2006.01)

(52) U.S. Cl. .............................. 257/351; 257/E21.088; 257/E29.004

(58) Field of Classification Search ................. 257/351, 257/E21.088, E29.004
See application file for complete search history.

(56) References Cited

U.S. PATENT DOCUMENTS

| | | | |
|---|---|---|---|
| 6,815,278 B1 * | 11/2004 | Ieong et al. ................. | 438/198 |
| 2002/0130378 A1 * | 9/2002 | Forbes et al. ................ | 257/412 |
| 2004/0217352 A1 * | 11/2004 | Forbes ......................... | 257/65 |
| 2005/0205859 A1 * | 9/2005 | Currie et al. .................. | 257/19 |

* cited by examiner

*Primary Examiner*—Thomas L Dickey
(74) *Attorney, Agent, or Firm*—Scully, Scott, Murphy & Presser, P.C.; Robert M. Trepp, Esq.

(57) ABSTRACT

Hybrid orientation substrates allow the fabrication of complementary metal oxide semiconductor (CMOS) circuits in which the n-type field effect transistors (nFETs) are disposed in a semiconductor orientation which is optimal for electron mobility and the p-type field effect transistors (pFETs) are disposed in a semiconductor orientation which is optimal for hole mobility. This invention discloses that the performance advantages of FETs formed entirely in the optimal semiconductor orientation may be achieved by only requiring that the device's channel be disposed in a semiconductor with the optimal orientation. A variety of new FET structures are described, all with the characteristic that at least some part of the FET's channel has a different orientation than at least some part of the FET's source and/or drain. Hybrid substrates into which these new FETs might be incorporated are described along with their methods of making.

28 Claims, 8 Drawing Sheets

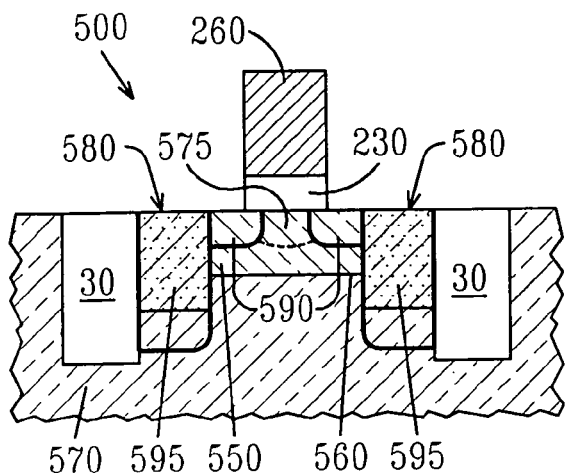
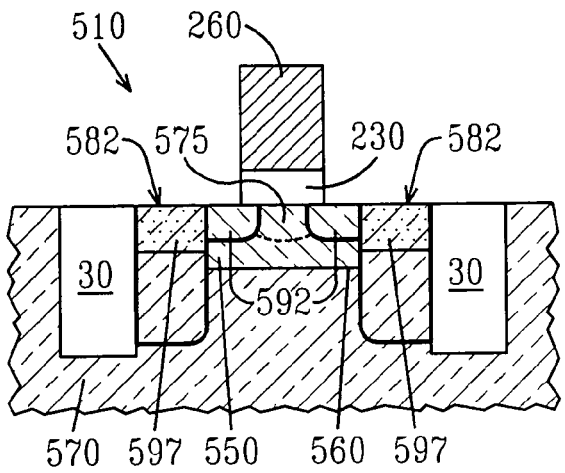
FIG.5A    FIG.5B
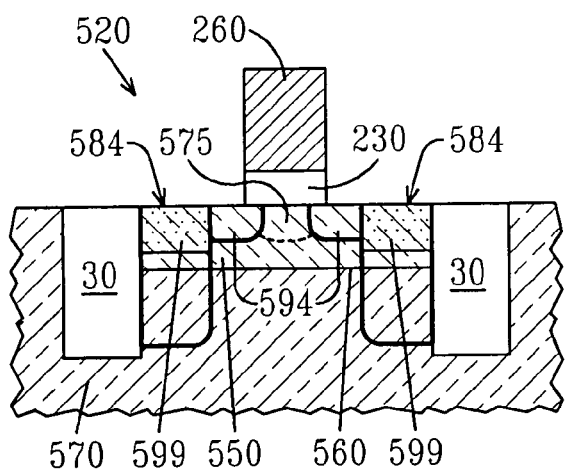
FIG.5C

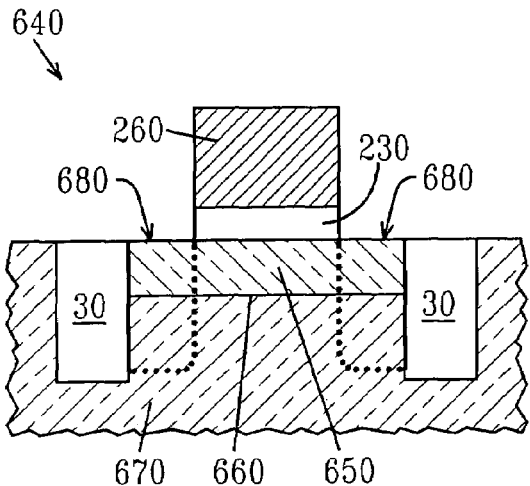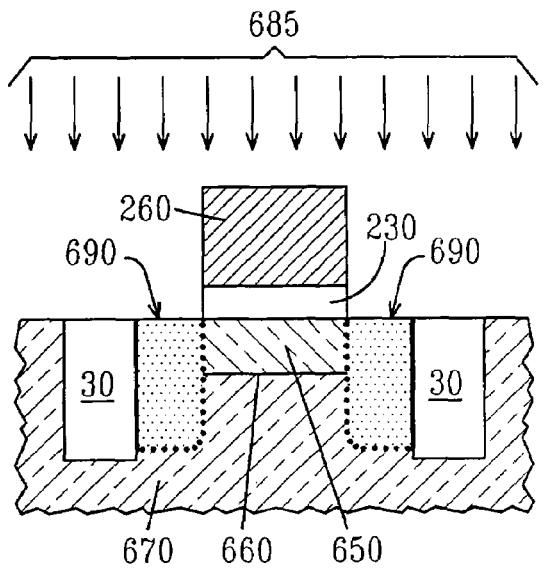
FIG.7A  FIG.7B
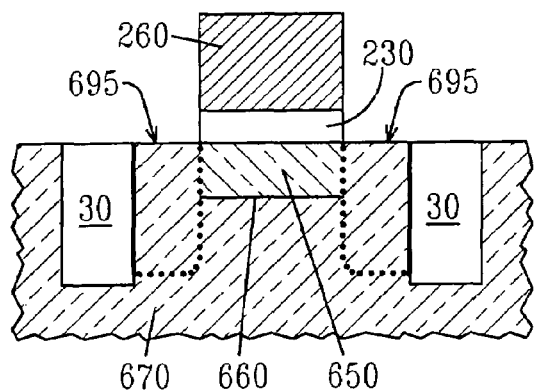
FIG.7C

FIELD EFFECT TRANSISTOR WITH MIXED-CRYSTAL-ORIENTATION CHANNEL AND SOURCE/DRAIN REGIONS

RELATED APPLICATIONS

The present application is related to co-pending and co-assigned U.S. Pat. No. 7,329,923, issued Feb. 12, 2008, entitled "High-performance CMOS devices on hybrid crystal oriented substrates," now U.S. Pat. No. 7,023,055, issued Apr. 4, 2006, entitled "CMOS on hybrid substrate with different crystal orientations using silicon-to-silicon direct wafer bonding," U.S. patent application Ser. No. 10/725,850, filed Dec. 2, 2003, entitled "Planar substrate with selected semiconductor crystal orientations formed by localized amorphization and recrystallization of stacked template layers," U.S. Pat. No. 7,238,589, issued Jul. 3, 2007, entitled "In-place bonding of microstructures," and U.S. Pat. No. 7,253,034, issued Aug. 7, 2007, entitled "Dual SIMOX hybrid orientation technology (HOT) substrates." The entire contents of each of the aforementioned references are incorporated herein by reference.

FIELD OF THE INVENTION

The present invention relates to complementary metal oxide semiconductor (CMOS) circuits in which n-type field effect transistors (nFETs) are disposed in a semiconductor with an orientation which is optimal for electron mobility and p-type field effect transistors (pFETs) are disposed in a semiconductor with a different orientation which is optimal for hole mobility. More particularly, the present invention relates to FET structures in which the performance advantages of FETs formed entirely in an optimally oriented semiconductor are achieved with structures in which only the device's channel is required to be disposed in the optimally oriented semiconductor. The present invention also relates to the methods by which these FETs may be incorporated into CMOS circuits on hybrid orientation substrates.

BACKGROUND OF THE INVENTION

Complementary metal oxide semiconductor (CMOS) circuits of present semiconductor technology comprise n-type field effect transistors (nFETs), which utilize electron carriers for their operation, and p-type field effect transistors (pFETs), which utilize hole carriers for their operation. CMOS circuits are typically fabricated on Si wafers having a single crystal orientation, ordinarily (100). However, since electrons have a higher mobility in Si with a (100) surface orientation (vs. a (110) orientation) and holes have higher mobility in Si with a (110) surface orientation (vs. a (100) orientation), there is great interest in fabricating CMOS circuits on hybrid orientation substrates so that nFETs may be formed in (100)-oriented Si and pFETs may be formed in (110)-oriented Si.

Examples of some prior art hybrid orientation substrates are shown in FIGS. 1A-1G. All the illustrated prior art substrates comprise coplanar, or substantially coplanar, surface regions of differently oriented single-crystal semiconductors, denoted as 10 and 20, separated by insulator-filled isolation trenches 30. (Here and in the figures that follow, different direction of crosshatching is used to indicate different semiconductor orientations.) Base substrate 40 is a single-crystal semiconductor having the same orientation as the semiconductor region 20. Base substrate 50 is typically a semiconductor or an insulator, orientation unspecified. Single-crystal semiconductor regions 60, 70, and 80 have an orientation that is the same as the orientation as the semiconductor region 20. Semiconductor regions 10 and 20 comprise part of a bulk substrate for the structures of FIGS. 1A and 1F; part of a semiconductor-on-insulator (SOI) substrate for the structures of FIGS. 1C, 1D, 1E, and 1G, with buried insulator layers 90 and/or localized buried insulator layers 100; and part of a mixed bulk/SOI substrate for the structure of FIG. 1B, with localized buried insulator layer 110. The structure of FIG. 1D has a layer of insulator between the semiconductor region 10 and the underlying semiconductor region 70, whereas the structures of FIGS. 1C and 1G have a direct semiconductor-to-semiconductor bonded (DSB) interface between the semiconductor region 10 and the underlying semiconductor regions 60 and 80.

Fabrication methods for the substrates shown in FIGS. 1A-1G vary, but all typically start with a (jkl)-oriented semiconductor layer bonded to a (j'k'l')-oriented semiconductor handle wafer or handle wafer layer. Depending on the fabrication method, the bonding may be direct (e.g., resulting in a semiconductor-to-semiconductor interface) or indirect (e.g., bonding in which an oxide or other insulating layer remains at the bonded interface in at least some areas). To produce the substrate structures of FIGS. 1A-1E, selected regions of the (jkl)-oriented semiconductor layer are replaced (along with any exposed buried insulator regions, if desired) with a semiconductor having the (j'k'l') orientation of the substrate. This may be done, for example, by a trench/epitaxial-growth process (such as described, for example, in U.S. Pat. No. 7,329,923, the contents of which were previously incorporated herein by reference) in which the (jkl)-oriented semiconductor is first etched away in selected regions to form openings that expose the underlying (j'k'l')-oriented semiconductor and then replaced by an epitaxially-grown semiconductor having the orientation of the substrate. Alternatively, one may use an amorphization/templated recrystallization (ATR) process (such as described, for example, in U.S. patent application Ser. No. 10/725,850, which disclosure was also previously incorporated herein by reference) in which selected regions of the (jkl)-oriented semiconductor are first amorphized to a depth below a DSB interface and then epitaxially recrystallized using the underlying (j'k'l')-oriented semiconductor as a template. Additional process steps may be performed to introduce or enhance buried insulator layers 90, 100, and 110, as described, for example, in U.S. patent application Ser. No. 10/725,850 and U.S. Pat. No. 7,253,034, the contents of which were also incorporated herein by reference. The structures of FIGS. 1F-1G would typically be fabricated by an in-place bonding technique (such as described, for example, in U.S. Pat. No. 7,238,589, the contents of which were also incorporated herein by reference), or by simply etching away regions of a (jkl)-oriented semiconductor layer directly bonded to a (j'k'l')-oriented substrate layer.

To date, all the nFETs and pFETs in CMOS circuits fabricated in such hybrid orientation substrates have one feature in common: the channel and source/drain regions of each FET are formed in a semiconductor having a single orientation, one selected to optimize the mobility for that FET's carriers. An example of such a conventional FET is shown in FIG. 2, where FET 200, formed in single-orientation semiconductor 210, comprises source and drain regions 220 bordered by insulator-filled isolation trenches 30, source/drain extensions 230, a semiconductor channel region (within region 240), gate dielectric 250, and conductive gate 260. (For clarity, the source/drain regions and source/drain extensions in subsequent figures may be identified by labels associated with their boundaries even though it is the semiconductor material within these boundaries that constitute the actual source/ drains and source/drain extensions.) Other common and/or advantageous FET components such as well implant regions, halo implants, sidewall spacers on the gate, raised source/drains, gate contacts, source/drain contacts, overlayers and/or replacement source/drain regions producing channel stress, etc., may be present, but are not shown in FIG. 2.

FETs with the geometry of FIG. 2 present no problem for hybrid orientation substrates having the structures of FIGS. 1B, 1D, or 1E, in which the single-crystal semiconductors 10 and 20 are bounded below by a bulk semiconductor of the same orientation (for the case of semiconductor 20) or by an underlying layer of insulator (for the case of semiconductor 20). However, such FET geometries are less compatible with hybrid orientation substrates having the structures of FIGS. 1A, 1C, 1F, and 1G, where (jkl)-oriented regions 10 are bounded below by (j'k'l')-oriented regions 60, 70, or 80, because the FET must either be "thin" (i.e., the source/drain regions must be shallower than the bonded (jkl)-oriented semiconductor layer) or, equivalently, disposed in a (jkl)-oriented DSB layer that is thicker than the depth of the source/drain regions. Such restrictions can be quite limiting: many CMOS circuits in bulk semiconductors utilize FETs with deep source/drains, and hybrid orientation substrates are typically easier to form when the DSB layer is thin. Thinner DSB layers are particularly desirable for hybrid substrates fabricated by ATR techniques, since the defectivity of the recrystallized semiconductor material tends to increase with the amorphization depth (which is constrained to be greater than the thickness of the DSB layer). For example, N. Burbure and K. S. Jones (Mat. Res. Soc. Symp. Proc. 810 C4.19.1, 2004) show that the lateral dimensions of corner defects left after ATR on Si substrates patterned with oxide-filled trenches are directly proportional to the depth of the amorphizing implant.

It would therefore be desirable to have an FET structure that has the advantages and performance of an FET fabricated in the optimum orientation of a semiconductor without requiring the entirety of the FET (i.e., its source/drain and channel) to be fabricated in a semiconductor with the optimum orientation.

SUMMARY OF THE INVENTION

It is therefore an object of the present invention to provide an FET structure having the advantages and performance of a conventional FET fabricated entirely in an optimally-oriented semiconductor without requiring the entirety of the FET (i.e., the channel and source/drain) to be fabricated in the optimally-oriented semiconductor.

It is a related object of the present invention to provide an FET structure having the advantages and performance of a conventional FET fabricated entirely in an optimally-oriented semiconductor disposed in a hybrid orientation substrate in which the layer of semiconductor having an orientation optimal for that FET's mobility is as thin as possible.

It is a further object of this invention to provide CMOS circuits in bulk and/or SOI hybrid orientation substrates, wherein said CMOS circuits include at least one of the inventive FETs satisfying at least one of the above objects, and at least one other conventional FET.

In accordance with the above listed and other objects, an FET structure is provided in which the FET's channel is contained in an upper semiconductor layer with a first single-crystal orientation, while at least some portion of the FET's source/drain regions are contained in an underlying direct-semiconductor-bonded single crystal semiconductor having a different orientation. More generally, an FET structure is provided in which at least some portion of the semiconductor comprising the source/drain regions will have an orientation that differs from the orientation of at least some portion of the semiconductor comprising the channel. The underlying single crystal semiconductor may be a bulk semiconductor or a semiconductor-on-insulator layer. For the cases of Si, Ge, and SiGe alloy semiconductors, crystallographic orientations would typically be selected from the group including (110), (111), and (100).

Several embodiments of the basic FET structure of the present invention are provided. For example, the direct-bonded surface semiconductor layer and the underlying differently-oriented semiconductor may comprise semiconductor materials that are the same or different, for example Si and SiGe. Semiconductor regions of a given orientation may furthermore include more than one semiconductor material, such as a layered semiconductor. The semiconductors comprising the source, drain, and channel regions may be strained, unstrained, or a composite of strained and unstrained regions. The source/drain regions may also include materials that differ from those of laterally adjacent semiconductor regions, as would be the case if portions of the original source/drain regions were replaced with different semiconductor materials, for example, if Si source/drain regions were replaced with SiGe. Other common and/or advantageous features described above in connection with conventional FETs may likewise be incorporated into the FET structure of the present invention.

The present invention also provides CMOS circuits in bulk and/or SOI hybrid orientation substrates, wherein said CMOS circuits include at least one FET whose source/drain and channel are not entirely contained in a single orientation of single-crystal semiconductor (as in accordance with the inventive FET structure described above), and at least one other FET whose source/drain and channel regions are entirely contained in a single orientation of a single-crystal semiconductor (as in accordance with a conventional FET structure).

BRIEF DESCRIPTION OF THE DRAWINGS

These and other features, aspects, and advantages will be more readily apparent and better understood from the following detailed description of the invention, in which:

FIGS. 5A-5C show, in cross section view, the FETs of the present invention for the case in which the source/drain regions may also include materials that differ from those of laterally adjacent semiconductor regions;

FIGS. 7A-7C show, in cross section view, an amorphization/templated recrystallization method by which the source/drain regions of an FET comprising two differently-oriented single-crystal semiconductor regions may be transformed into source/drain regions comprising just one single-crystal semiconductor region.

DETAILED DESCRIPTION OF THE INVENTION

The present invention, which provides an FET structure in which at least some portion of the semiconductor comprising the source/drain regions has an orientation that differs from the orientation of at least some portion of the semiconductor comprising the channel, will now be described in greater detail. The underlying single-crystal semiconductor of the inventive FET structure may be a bulk semiconductor or a semiconductor-on-insulator layer. The embodiments of FIGS. 3-5 are shown for the case in which the underlying single-crystal semiconductor is a bulk semiconductor.

Figure 2:
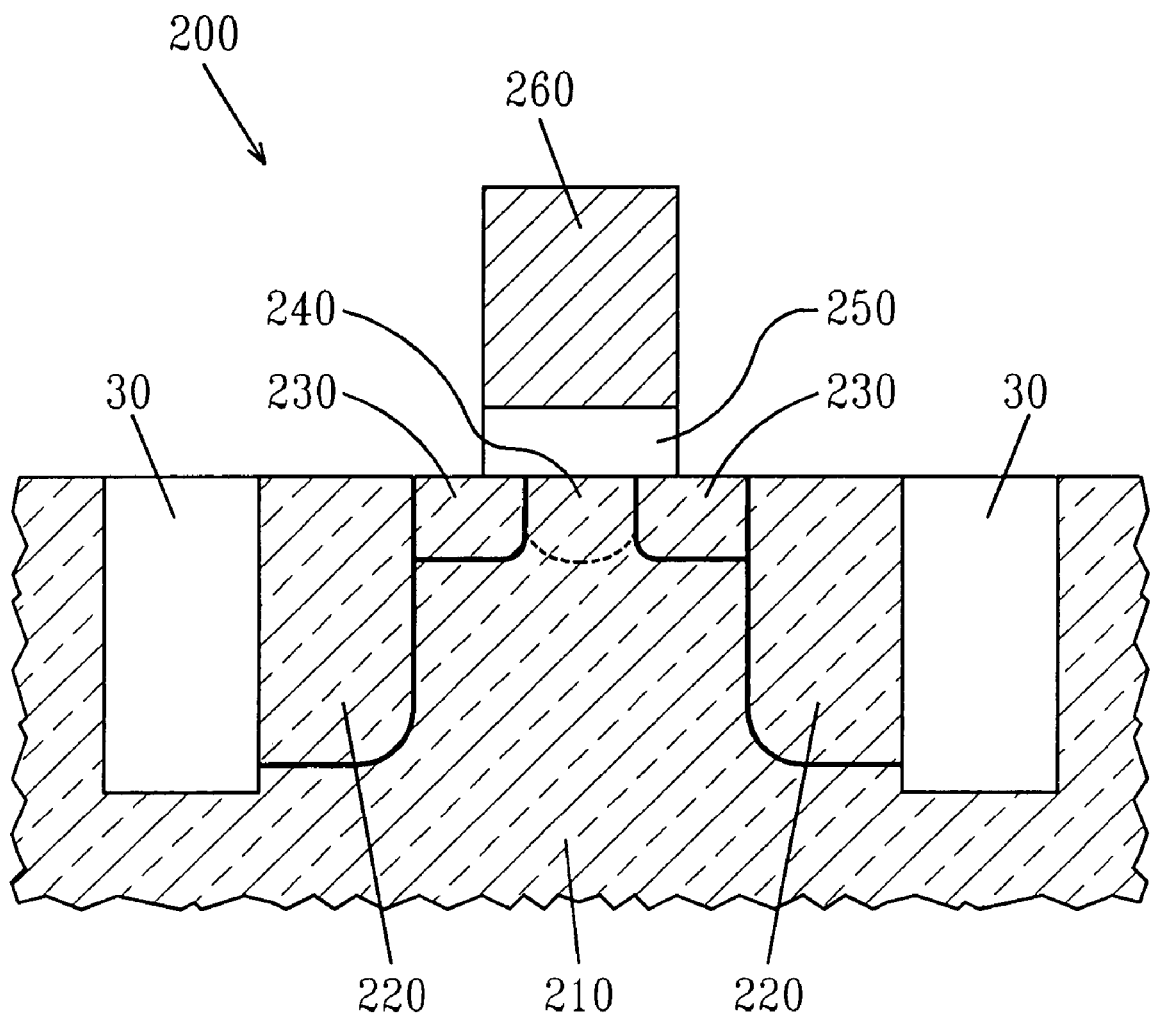
FIG. 2 shows, in cross section view, a conventional-geometry FET in which the channel and source/drain regions of the FET are formed in a semiconductor having a single orientation, one preferably selected to optimize the mobility for that FET's carriers.
Figure 3A:
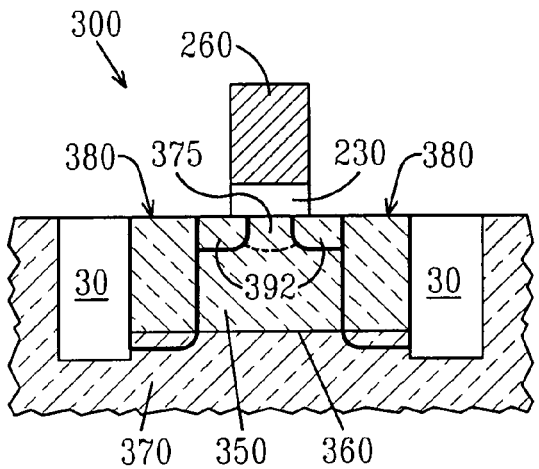
FIGS. 3A-3D show, in cross section view, the FETs of the present invention for the case in which an upper portion of the source/drain regions have the same orientation as the channel, while a lower portion of the source/drain regions have an orientation that is different from the orientation of the channel.
Figure 3B:
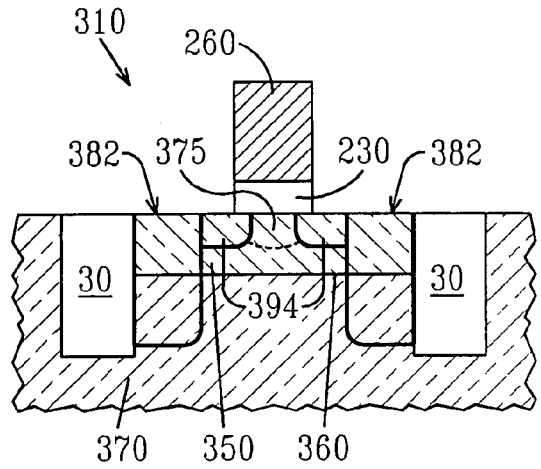
Figure 3C:
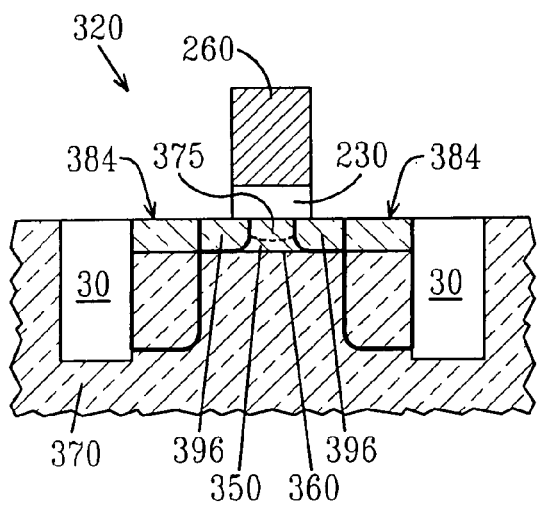
Figure 3D:
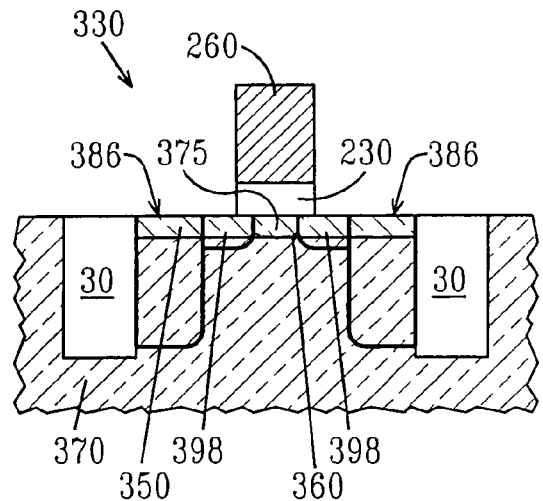

FIGS. 3A-3D show FETs of the present invention for cases in which an upper portion of the source/drain regions has the same orientation as the channel, while a lower portion of the source/drain regions has an orientation that is different from the orientation of the channel. FETs 300, 310, 320, and 330 of FIGS. 3A-3D contain upper single-crystal semiconductor layer 350 having a first orientation, joined at bonded interface 360 to lower single-crystal semiconductor 370 having a second orientation that is different from the first. Elements in each of the FIGS. 3A-3D FETs, similar to those of the FET 200 in FIG. 2, include gate conductor 260, gate dielectric 230, and insulator-filled isolation trenches 30. Also included in each of the FETs of FIGS. 3A-3D is a semiconductor channel region in the upper semiconductor 350 (within region 375), source/drain regions 380, 382, 384, or 386, and optional source/drain extension regions 392, 394, 396 or 398.

In FIGS. 3A-3D, source/drain regions above the bonded interface 360 have the orientation of the upper semiconductor 350 and source/drain regions below the bonded interface 360 have the orientation of the lower semiconductor 370, so that each part of the source/drain has the same crystal orientation as the semiconductor material laterally adjacent to it. FETs 300, 310, 320, and 330 differ only in the location of the bonded interface 360 in relation to the bottom of the source/drain regions. In FETs 300, 310, and 320, optional source/drain extensions 392, 394 and 396 are disposed entirely in the upper semiconductor layer 350. In FET 300, the bonded interface 360 is situated towards the bottom of source/drain regions 380, leaving source/drains 380 mostly in upper semiconductor layer 350. In FET 310, the bonded interface 360 is situated at a depth corresponding to about half the source/drain thickness, leaving source/drains 382 approximately evenly split between the upper semiconductor layer 350 and the lower semiconductor layer 370. In FET 320, the bonded interface 360 is situated towards the top of source/drain regions 384, at a depth approximately even with the bottom of optional source/drain extensions 396 (if present), leaving source/drains 384 mostly in the lower semiconductor layer 370. In FET 330, the bonded interface 360 is even closer to the surface (vs. its position in FET 320). Source/drain regions 386 in FET 330 are nearly entirely disposed in the lower semiconductor 370, and optional source/drain extensions 398 (if present) are approximately evenly split between the upper semiconductor layer 350 and the lower semiconductor layer 370.

FIGS. 4A-4E show the FETs of the present invention for cases in which the entirety of the source/drain regions have an orientation that is different from the orientation of the channel. FETs 400, 410, 420, 430, and 440 of FIGS. 4A-4E contain upper single-crystal semiconductor layer 450 having a first orientation, joined at bonded interface 460 to lower single-crystal semiconductor 470 having a second orientation different from the first. Elements of the FIG. 4 FETs similar to those of FET 200 in FIG. 2 include gate conductor 260, gate dielectric 230, and insulator-filled isolation trenches 30. Also included in each of the FETs of FIGS. 4A-4E is a semiconductor channel region (within region 475) in the upper single-crystal semiconductor 450, source/drain regions 480, 482, 484, 486, or 488, and optional source/drain extension regions 490, 492, 494, 496, or 498. Dotted line 460' shows the location of the bonded interface 460 were it to be extended laterally into source/drain regions 480, 482, 484, or 486 in FIGS. 4A-4D, or into semiconductor region 499 below source/drain regions 488 in FIG. 4E. The process steps by which the bonded interface 460 is made to disappear from the source/drain regions will be discussed later, in connection with FIGS. 7A-7C.

In FIGS. 4A-4E, channel region 475 and optional source/drain extensions 490, 492, 494, 496 and 498 have the orientation of the upper semiconductor 450, while the entirety of source/drain regions have the orientation of the lower semiconductor 470. In contrast to the FETs of FIGS. 3A-3D, the source/drain regions above dotted line 460' have a crystal orientation that is different from that of the laterally adjacent semiconductor. FETs 400, 410, 420, and 430 of FIGS. 4A-4D differ only in the location of the bonded interface 460 in relation to the bottom of the source/drain regions. In FETs 400, 410, 420, and 440, optional source/drain extensions 490, 492, 494, and 498 are disposed entirely in upper semiconductor layer 450. In FET 400, the bonded interface 460 is situated towards the bottom of source/drain regions 480, leaving source/drains 480 mostly in upper region of lower semiconductor layer 470 adjacent to upper semiconductor 450. In FET 410, the bonded interface 460 is situated at a depth corresponding to about half the source/drain thickness, leaving source/drains 482 approximately evenly split between the upper semiconductor layer 450 and the lower semiconductor layer 470. In FET 420, the bonded interface 460 is situated towards the top of source/drain regions 484, at a depth approximately even with the bottom of optional source/drain extensions 494 (if present), leaving source/drains 484 mostly in the lower semiconductor layer 470. In FET 430, the bonded interface 460 is even closer to the surface (vs. its position in FET 420). Source/drain regions 486 in FET 430 are nearly entirely disposed in lower semiconductor 470, and optional source/drain extensions 496 (if present) are approximately evenly split between upper semiconductor layer 450 and the lower semiconductor layer 470.

Figure 4A:
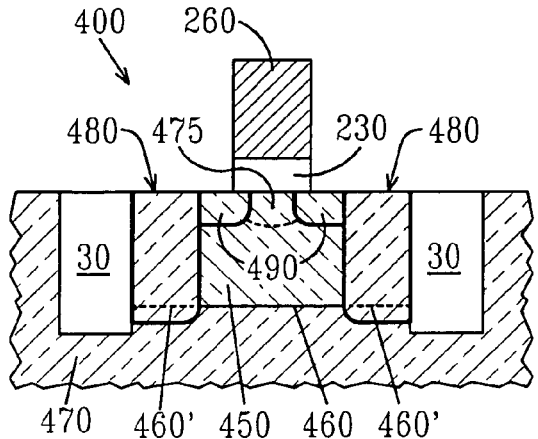
FIGS. 4A-4E show, in cross section view, the FETs of the present invention for the case in which the entirety of the source/drain regions have an orientation that is different from the orientation of the channel.
Figure 4B:
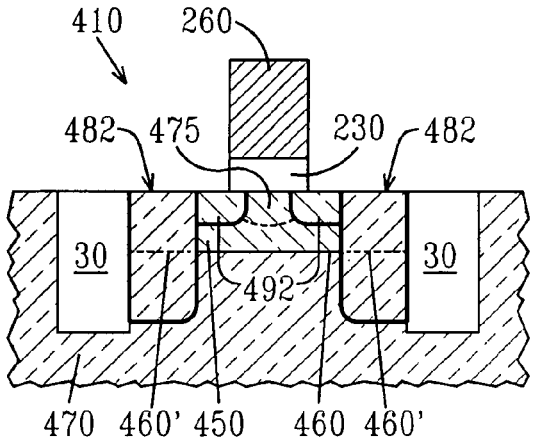
Figure 4C:
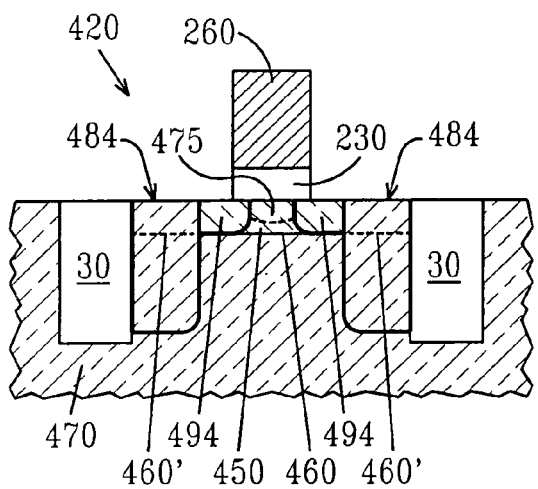
Figure 4D:
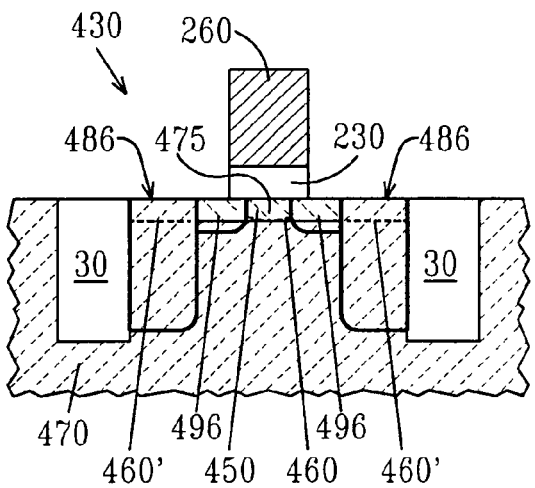
Figure 4E:
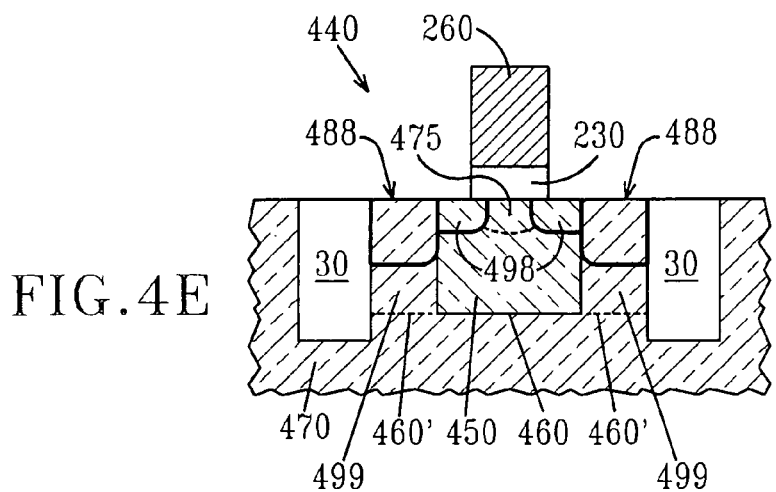
Figure 6A:
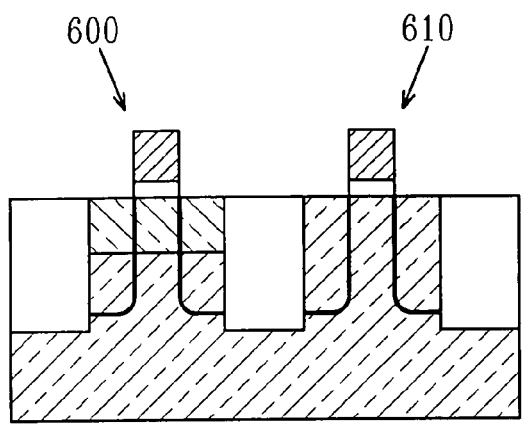
FIGS. 6A-6D show, in cross section view, one nFET and one pFET of a CMOS circuit on different hybrid orientation substrates, where one of the FETs is an FET of the present invention and the other is a conventional FET.
Figure 6B:
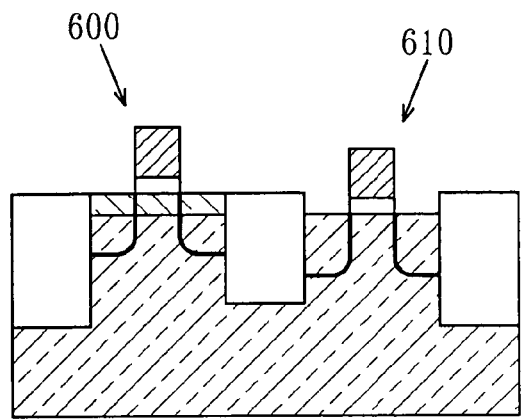
Figure 6C:
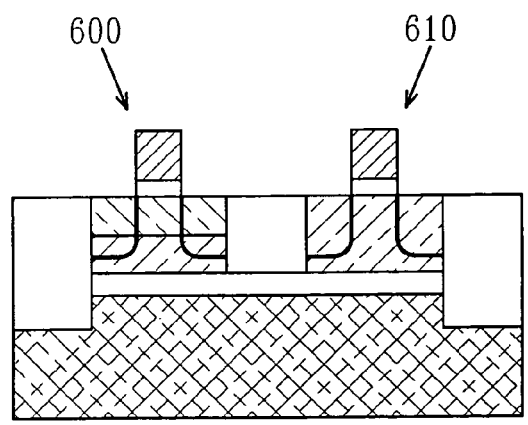
Figure 6D:
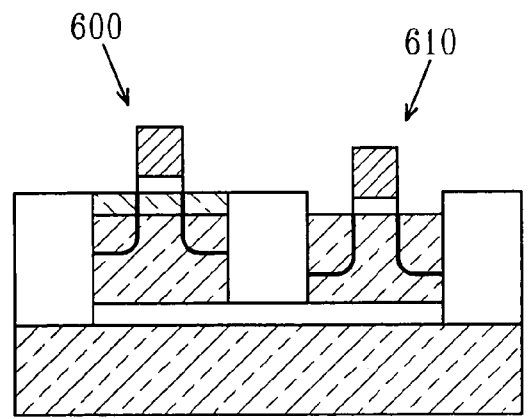

The FET of FIG. 4E also includes semiconductor region 499 disposed under source/drain regions 498 and above dotted line 460'. The process steps for forming regions 498 and 499 will be discussed later, in connection with FIGS. 7A-7C.

FIGS. 5A-5C shows FETs of the present invention for cases in which at least some portion of the source/drain regions (and/or source/drain extension regions) include semiconductor materials that differ from those of laterally adjacent semiconductor regions, as would be the case if portions of the original source/drain regions were removed and then replaced with one or more different semiconductor materials. FETs 500, 510, and 520 of FIGS. 5A-5C contain upper single-crystal semiconductor layer 550 having a first orientation, joined at bonded interface 560 to lower single-crystal semiconductor 570 having a second orientation different from the first. Elements in each of the FIGS. 5A-5C FETs, similar to those of FET 200 in FIG. 2, include gate conductor 260, gate dielectric 230, and insulator-filled isolation trenches 30. Also included in each of the FETs of FIGS. 5A-5C is a semiconductor channel region in upper semiconductor 550 (within region 575), source/drain regions 580, 582, or 584, and optional source/drain extension regions 590, 592, or 594. In FIG. 5A, the material of semiconductor 595 in source/drain region 580 of FET 500 has the orientation of the lower semiconductor 570, and is different from the material of upper semiconductor layer. FET 510 of FIG. 5B is similar to FET 500 of FIG. 5A in that the material of semiconductor 597 in source/drain regions 582 has the orientation of lower semiconductor 570, and is different from the material of upper semiconductor layer 550. FET 510 differs from FET 500 in that semiconductor 597 in FET 510 does not extend below interface 560 whereas semiconductor 595 of FET 500 does. In FIG. 5C, the material of semiconductor 599 in source/drain region 584 of FET 520 has the orientation of upper semiconductor layer 550 and is different from the material of upper semiconductor layer. The process steps for forming regions 595, 597, and 599 will be discussed later, in connection with FIGS. 8A-8D.

The FET geometries of FIGS. 5A-5C may be used to produce a strained channel, for example, by removing Si source/drain material and replacing it with SiGe. This approach has particular advantages for the case when the upper semiconductor is (110)-oriented Si and the source/drain regions are replaced by (100)-oriented SiGe templating from an underlying Si semiconductor with a (100) orientation, since (100)-oriented SiGe is expected to be easier to grow than (110)-oriented SiGe.

The source/drain extensions in FIGS. 3-5 are shown as having the same orientation as the channel. While this orientation is the preferred orientation for the extensions (to avoid a grain boundary defect between the extensions and the channel), there may be some cases in which it would be desirable for the extensions to have the same orientation as the laterally adjacent semiconductor in the source/drain regions (when this orientation differs from the orientation of the channel). Embodiments with this feature are therefore also within the scope of this invention.

Likewise, while the channel in FIGS. 3-5 is shown as falling completely within the upper semiconductor, there may be cases in which it would be desirable for some of the channel to be within the upper semiconductor and some of it to be in the differently oriented semiconductor below. Embodiments with this feature are therefore also within the scope of this invention.

The direct-bonded surface semiconductor layer, the underlying differently-oriented semiconductor, and any additional semiconductors in the source/drain regions may comprise semiconductor materials that are the same or different, and may be selected from the group including Si, SiC, SiGe, SiGeC, Ge alloys, Ge, C, GaAs, InAs, InP as well as other III-V or II-VI compound semiconductors. Layered combinations or alloys of the aforementioned semiconductor materials (for example, Si layers on SiGe), with or without one or more dopants, are also contemplated herein. The semiconductors comprising the source, drain, channel, and other semiconductor regions may be doped with As, B, C, P, Sb, and/or other species, as desired. The semiconductors comprising the source, drain, and channel regions may be strained, unstrained, or a composite of strained and unstrained regions. For the cases of Si, Ge, and SiGe alloy semiconductors, crystallographic orientations would typically be selected from the group including (110), (111), and (100).

Other common and/or advantageous features described above in connection with conventional FETs (well implant regions, halo implants, sidewall spacers on the gate, raised source/drains, gate contacts, source/drain contacts, overlayers and/or replacement source/drain regions designed to induce channel stress, etc.) as well as more optimized positioning of the source/drain and source/drain extension implants may likewise be incorporated into the FET structure of the present invention.

In all cases, the FET structures of this invention comprise a composite semiconductor region containing spaced-apart doped source and drain regions with a channel disposed therebetween, a gate dielectric disposed on said channel, and a conductive gate disposed on said gate dielectric, wherein said composite semiconductor region under said gate comprises an upper single-crystal semiconductor having a first orientation and a lower single-crystal semiconductor having a second orientation, said upper and lower semiconductors being in direct contact at a bonded interface; at least some portion of said channel disposed in said upper semiconductor with said first orientation, and at least some portion of said source and drain regions disposed in a semiconductor having the orientation of said lower semiconductor.

Figure 1A:
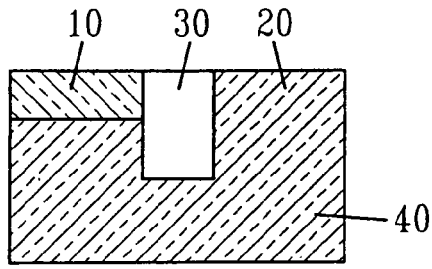
FIGS. 1A-1G show, in cross section view, examples of prior art planar hybrid-orientation semiconductor substrate structures.
Figure 1B:
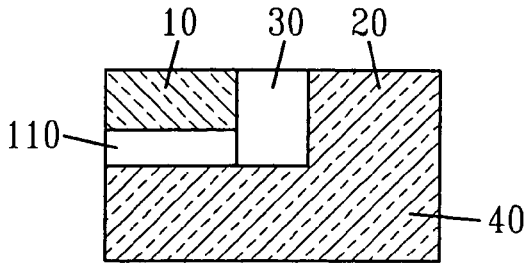
Figure 1C:
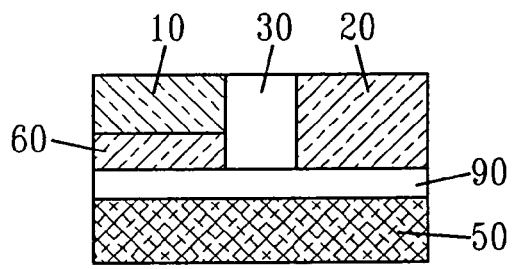
Figure 1D:
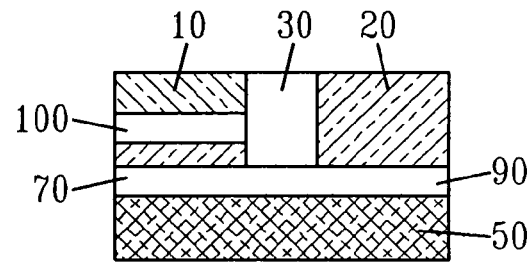
Figure 1E:
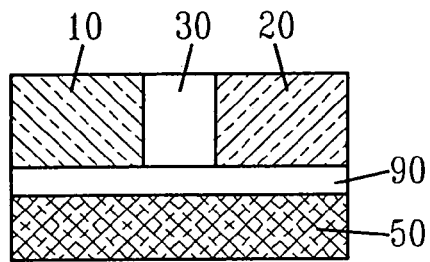
Figure 1F:
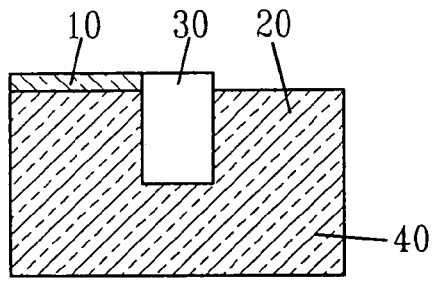
Figure 1G:
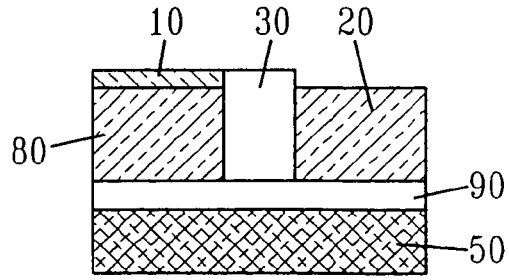

In another aspect of this invention, CMOS circuits are provided in hybrid orientation substrates, wherein said CMOS circuits include at least one FET whose source/drain and channel are not entirely contained in a single orientation of single-crystal semiconductor (i.e., an FET of the present invention). Such circuits would typically have at least one other FET whose source/drain and channel regions are entirely contained in a single orientation of a single-crystal semiconductor (i.e., a conventional FET). As shown in FIGS. 6A-6D, such CMOS circuits may be disposed on hybrid orientation substrates providing bulk-like properties (e.g., the substrates of FIGS. 1A and 1F, shown in FIGS. 6A and 6B) or semiconductor-on-insulator properties (e.g., the substrates of FIGS. 1C and 1G, shown in FIGS. 6C and 6D). FETs 600 and 610 of FIGS. 6A-6D correspond, respectively, to an FET of the present invention and a conventional FET; one of FETs 600 and 610 is an nFET and the other is a pFET.

The process steps for fabricating the hybrid orientation substrates, the FET structures of the present invention, and the CMOS circuits in which they are incorporated are generally well known to the prior art. The only additional step required for making the FETs and CMOS circuits of this invention is the selection of source/drain implant conditions that will produce an implanted region extending below the bottom of DSB layer. However, it is worth elaborating on the methods by which the upper portions of the source/drain regions of an FET may end up with an orientation and/or a material different from the channel.

FIGS. 7A-7C show an amorphization/templated recrystallization method by which the source/drain regions of an FET comprising two differently-oriented single-crystal semiconductor regions may be transformed into source/drain regions comprising just one single-crystal semiconductor region. FIG. 7A shows a partially completed FET structure 640 containing upper single-crystal semiconductor layer 650 having a first orientation, joined at bonded interface 660 to lower single-crystal semiconductor 670 having a second orientation different from the first. Elements of the structure 640 similar to those of FET 200 in FIG. 2 include gate conductor 260, gate dielectric 230, and insulator-filled isolation trenches 30. Regions 680 (outlined by dotted lines) indicate the expected position of the source and drain regions. FIG. 7B shows the structure of FIG. 7A being subjected to ion implantation 685, using gate conductor 260 as a mask, creating amorphized regions 690. Implants may be amorphizing only (e.g., Si+ or Ge+ implants into Si) or amorphizing and doping (e.g., B+, P+, or As+ alone into Si, or in combination with Si+ or Ge+ into Si). Amorphized regions 690 are then recrystallized by solid phase epitaxy to the orientation of lower semiconductor 670, to form semiconductor regions 695. Structures like FET 400 of FIG. 4A might be formed when the amorphizing implant has the same depth as the dopant implant whereas structures like FET 440 of FIG. 4E might be formed with the dopant implant is shallower than the amorphizing implant.

Figure 8A:
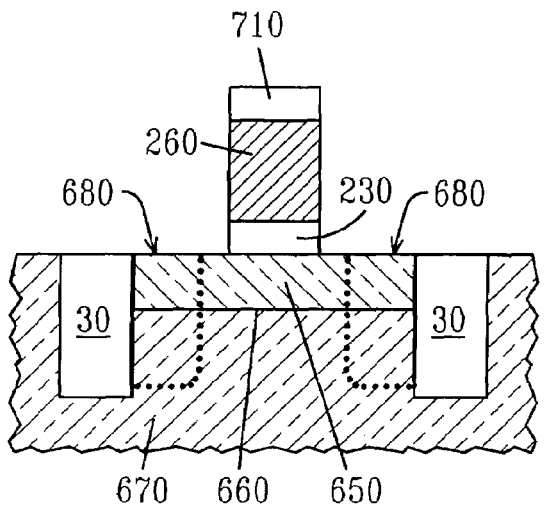
FIGS. 8A-8D show, in cross section view, a trench/epitaxial-growth method by which the source/drain regions of an FET comprising two differently-oriented single-crystal semiconductor regions may be replaced by source/drain regions comprising just one single-crystal semiconductor region.
Figure 8B:
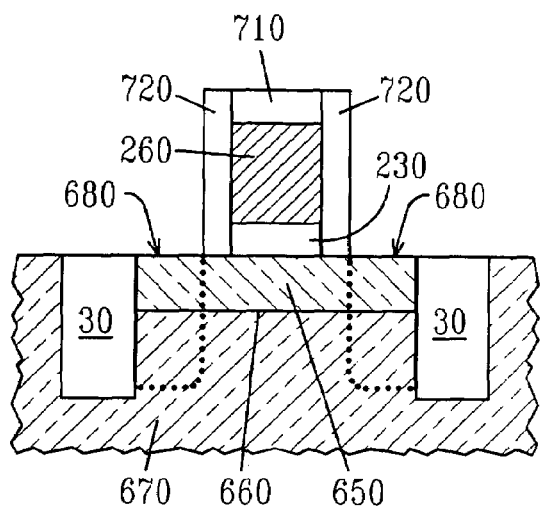
Figure 8C:
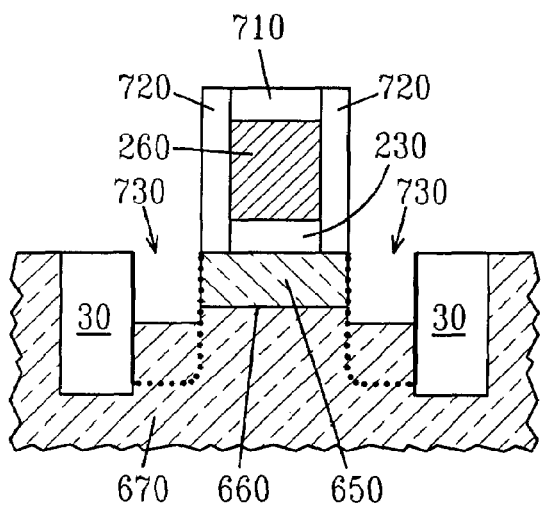
Figure 8D:
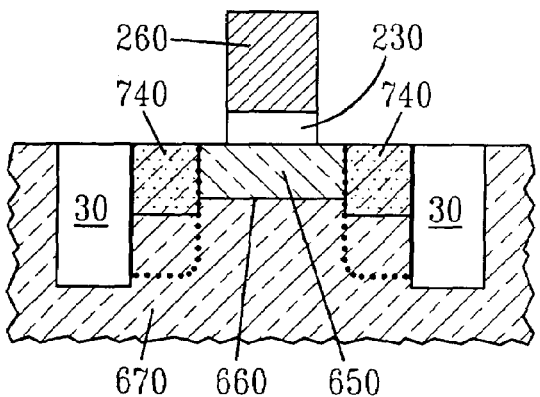

FIGS. 8A-8D show a trench/epitaxial-growth method by which the source/drain regions of an FET comprising two differently-oriented single-crystal semiconductor regions may be replaced by source/drain regions comprising just one single-crystal semiconductor region. FIG. 8A shows the structure of FIG. 7A with an additional gate passivation layer 710 on the top surface of gate conductor 260. FIG. 8B shows the structure of FIG. 8A after dielectric sidewall spacers 720 have been formed on the side of the gate conductor 260. FIG. 8C shows the structure of FIG. 8B after semiconductor material in the vicinity of the expected source/drain regions 680 has been etched away to a depth below bonded interface 660 to form cavities 730. Cavities 730 are then filled with an epitaxially grown semiconductor 740 having the orientation of lower semiconductor 670, after which gate passivation layer 710 and spacers 720 are removed to form the structure of FIG. 8D. The process steps of FIGS. 7A-7C and 8A-8D may be combined to fabricate structures such as FET 520 of FIG. 5C.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims

What is claimed is:

1. A field effect transistor (FET) comprising:
a composite semiconductor region containing spaced-apart doped source and drain regions with a channel disposed therebetween,
a gate dielectric disposed on said channel, and
a conductive gate disposed on said gate dielectric, said composite semiconductor region under said gate comprises an upper single-crystal semiconductor having a first surface orientation, and a lower single-crystal semiconductor having a second surface orientation which differs from the first surface orientation and where said upper and lower semiconductors are in direct contact at a bonded interface and said channel is located only within said upper single-crystal semiconductor with said first surface orientation, and the entirety of both said source and drain regions has the second surface orientation.

2. The FET of claim 1 further comprising at least one of well implants, halo implants, sidewall spacers on said gate, raised source/drains, gate contacts, source/drain contacts, overlayers and/or replacement source/drain regions producing channel stress, or source/drain extensions.

3. The FET of claim 1 wherein said lower semiconductor is a bulk semiconductor wafer.

4. The FET of claim 1 wherein said lower semiconductor is a semiconductor-on-insulator layer.

5. The FET of claim 1 wherein said upper and lower semiconductors are the same semiconductor material.

6. The FET of claim 1 wherein said upper and lower semiconductors are different semiconductor materials.

7. The FET of claim 1 wherein said upper and said lower semiconductors comprise Si, SiC, SiGe, SiGeC, Ge alloys, Ge, C, GaAs, InAs, InP, other III-V or II-VI compound semiconductors or layered combinations and alloys of the aforementioned semiconductor materials.

8. The FET of claim 1 wherein said upper and said lower semiconductors comprise at least one dopant.

9. The FET of claim 1 wherein said upper and said lower semiconductors include a strained region.

10. The FET of claim 1 wherein the upper and lower semiconductors comprising the source, drains, and channel regions are strained, unstrained, or a composite of strained and unstrained regions.

11. The FET of claim 1 wherein said upper and lower semiconductors comprise Si, SiGe alloys, or Ge.

12. The FET of claim 11 wherein said first and second surface orientations are selected from the group consisting of (100), (110) and (111).

13. The FET of claim 1 wherein at least some portion of said source and drain regions includes a semiconductor material of said second surface orientation that differs from the semiconductor material of channel.

14. The FET of claim 13 wherein said channel comprises Si and said laterally adjacent source/drain regions comprise a SiGe semiconductor.

15. The FET of claim 1 further comprising source/drain extensions, said source/drain extensions having the same or different surface orientation as that of said channel.

16. A CMOS circuit comprising at least one field effect transistor (FET) including a composite semiconductor region containing spaced-apart doped source and drain regions with a channel disposed therebetween, a gate dielectric disposed on said channel, and a conductive gate disposed on said gate dielectric, said composite semiconductor region under said gate comprises an upper single-crystal semiconductor having a first surface orientation, and a lower single-crystal semiconductor having a second surface orientation which differs from the first surface orientation and where said upper and lower semiconductors are in direct contact at a bonded interface and said channel is located only within said upper single-crystal semiconductor with said first surface orientation, and the entirety of both said source and drain regions has said second surface orientation.

17. The CMOS circuit of claim 16 further comprising at least one of well implants, halo implants, sidewall spacers on said gate, raised source/drains, gate contacts, source/drain contacts, overlayers and/or replacement source/drain regions producing channel stress, or source/drain extensions.

18. The CMOS circuit of claim 16 wherein said lower semiconductor is a bulk semiconductor wafer or a semiconductor-on-insulator.

19. The CMOS circuit of claim 16 wherein said upper and lower semiconductors are the same or different semiconductor materials.

20. The CMOS circuit of claim 16 wherein said upper and said lower semiconductors comprise Si, SiC, SiGe, SiGeC, Ge alloys, Ge, C, GaAs, InAs, InP, other III-V or II-VI compound semiconductors or layered combinations and alloys of the aforementioned semiconductor materials.

21. The CMOS circuit of claim 16 wherein said upper and said lower semiconductors comprise at least one dopant.

22. The CMOS circuit of claim 16 wherein said upper and said lower semiconductors include a strained region.

23. The CMOS circuit of claim 16 wherein the upper and lower semiconductors comprising the source, drain, and channel regions are strained, unstrained, or a composite of strained and unstrained regions.

24. The CMOS circuit of claim 16 wherein said upper and lower semiconductors comprise Si, SiGe alloys, or Ge.

25. The CMOS circuit of claim 24 wherein said first and second surface orientations are selected from the group consisting of (100), (110) and (111).

26. The CMOS circuit of claim 16 wherein at least some portion of said source and drain regions includes a semiconductor material of said second surface orientation that differs from the semiconductor material of channel.

27. The CMOS circuit of claim 26 wherein said channel comprises Si and said laterally adjacent source/drain regions comprise a SiGe semiconductor.

28. The CMOS circuit of claim 16 further comprising another FET whose source/drain and channel regions are entirely contained in a single surface orientation of a single-crystal semiconductor.

* * * * *